(12) United States Patent
Xiong et al.

(10) Patent No.: US 12,284,884 B1
(45) Date of Patent: Apr. 22, 2025

(54) DISPLAY PANEL AND DISPLAY DEVICE

(71) Applicants: Wuhan Tianma MicroElectronics Co., Ltd. Shanghai Branch., Shanghai (CN); Wuhan Tianma Micro-Electronics Co., Ltd., Wuhan (CN)

(72) Inventors: Nana Xiong, Shanghai (CN); Bonggeum Lee, Shanghai (CN); Chong Qian, Shanghai (CN)

(73) Assignees: Wuhan Tianma MicroElectronics Co., Ltd. Shanghai Branch., Shanghai (CN); Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 18/625,138

(22) Filed: Apr. 2, 2024

(30) Foreign Application Priority Data

Dec. 18, 2023 (CN) .......................... 202311751525.4

(51) Int. Cl.
*H10K 59/13* (2023.01)
*G06F 3/041* (2006.01)
*G09G 3/3233* (2016.01)

(52) U.S. Cl.
CPC .......... *H10K 59/13* (2023.02); *G06F 3/0412* (2013.01); *G09G 3/3233* (2013.01); *G09G 2300/0842* (2013.01); *G09G 2300/0861* (2013.01); *G09G 2320/0242* (2013.01); *G09G 2320/0626* (2013.01); *G09G 2330/021* (2013.01); *G09G 2354/00* (2013.01); *G09G 2360/144* (2013.01)

(58) Field of Classification Search
CPC .... H10K 59/13; G06F 3/0412; G09G 3/3233; G09G 1360/14; G09G 2300/0842; G09G 2300/0861; G09G 2320/0242; G09G 2320/0626; G09G 2330/021; G09G 2354/00; G09G 2360/144
USPC ................................................... 345/207, 76
See application file for complete search history.

(56) References Cited

U.S. PATENT DOCUMENTS

| | | | |
|---|---|---|---|
| 2009/0027371 A1* | 1/2009 | Lin | H01L 31/145 257/E31.085 |
| 2018/0060641 A1* | 3/2018 | Kim | G06V 40/1335 |
| 2024/0040810 A1* | 2/2024 | Yun | H10K 85/322 |
| 2024/0334794 A1* | 10/2024 | Hai | H10K 59/60 |

* cited by examiner

*Primary Examiner* — Jimmy H Nguyen
(74) *Attorney, Agent, or Firm* — Anova Law Group, PLLC

(57) ABSTRACT

A display panel and a display device are provided. The display panel has a display region and a non-display region. The display panel includes: a substrate; a driving array layer including first pixel circuits in the non-display region and second pixel circuits in the display region; a light-emitting device layer including first light-emitting devices in the non-display region and second light-emitting devices in the display region; and a photosensitive device assembly including first photosensitive devices and second photosensitive devices in the driving array layer. The first light-emitting devices are electrically connected with the first pixel circuits and the second light-emitting devices are electrically connected with the second pixel circuits. An orthographic projection of one first photosensitive device to the substrate at least partially overlaps an orthographic projection of one corresponding first light-emitting device to the substrate, and the second photosensitive devices are arranged in the display region.

16 Claims, 14 Drawing Sheets

Dummy region    AA region

DISPLAY PANEL AND DISPLAY DEVICE

CROSS-REFERENCE TO RELATED APPLICATION

This application claims the priority of Chinese Patent Application No. 202311751525.4, filed on Dec. 18, 2023, the content of which is incorporated herein by reference in its entirety.

TECHNICAL FIELD

The present disclosure generally relates to the field of display technology and, more particularly, relates to a display panel and a display device.

BACKGROUND

With the development of display technology, people have higher and higher requirements for display quality of display products. To improve the display quality of the display products, an existing display product generally has an automatic brightness adjustment function. The display product obtains brightness of its usage environment and adjusts its own luminous brightness according to the brightness of the usage environment. When the brightness of the usage environment of the display product is high, the display product increases its own luminous brightness. When the brightness of the usage environment of the display product is low, the display product lowers its own luminous brightness. The display quality is improved. Further, since the luminous brightness of the display product is low when the brightness of the usage environment is low, the display product is prevented from being in a high-brightness state for a long time, to reduce the power consumption of the display product.

However, existing display products are not accurate enough for automatic brightness adjustment.

SUMMARY

One aspect of the present disclosure provides a display panel. The display panel has a display region and a non-display region. The display panel includes: a substrate; a driving array layer on the substrate, including first pixel circuits located in the non-display region and second pixel circuits located in the display region; a light-emitting device layer on a side of the driving array layer away from the substrate, including first light-emitting devices located in the non-display region and second light-emitting devices located in the display region; and a photosensitive device assembly including first photosensitive devices and second photosensitive devices arranged in the driving array layer. The first light-emitting devices are electrically connected with the first pixel circuits respectively and the second light-emitting devices are electrically connected with the second pixel circuits respectively. An orthographic projection of one first photosensitive device to the substrate is at least partially overlapped with an orthographic projection of one corresponding first light-emitting device to the substrate, and the second photosensitive devices are arranged in the display region.

Another aspect of the present disclosure provides a display device. The display device includes a display panel. The display panel has a display region and a non-display region. The display panel includes: a substrate; a driving array layer on the substrate, including first pixel circuits located in the non-display region and second pixel circuits located in the display region; a light-emitting device layer on a side of the driving array layer away from the substrate, including first light-emitting devices located in the non-display region and second light-emitting devices located in the display region; and a photosensitive device assembly including first photosensitive devices and second photosensitive devices arranged in the driving array layer. The first light-emitting devices are electrically connected with the first pixel circuits respectively and the second light-emitting devices are electrically connected with the second pixel circuits respectively. An orthographic projection of one first photosensitive device to the substrate is at least partially overlapped with an orthographic projection of one corresponding first light-emitting device to the substrate, and the second photosensitive devices are arranged in the display region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
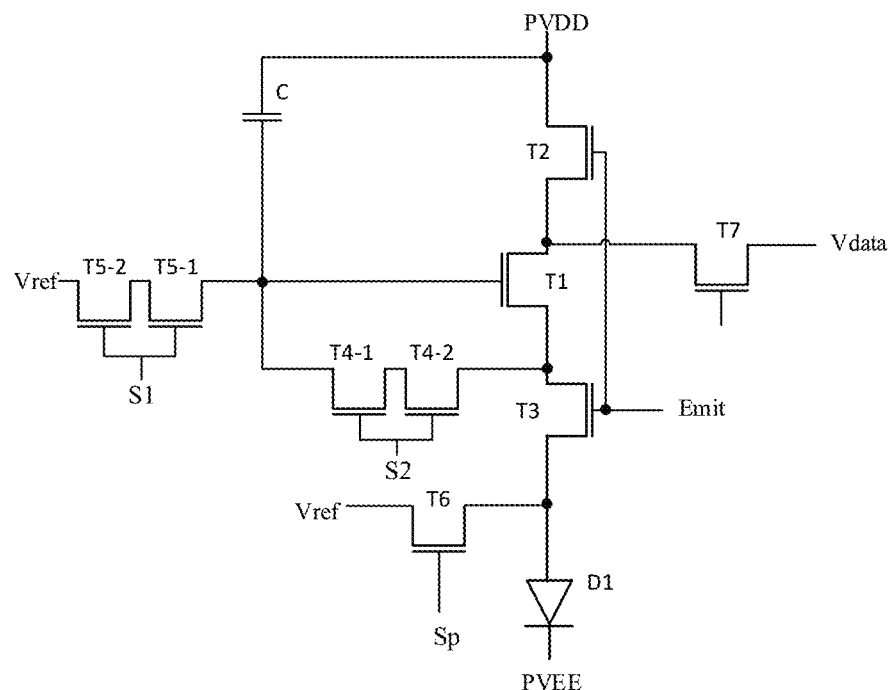
FIG. 1 illustrates a pixel circuit.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In the present disclosure, relational terms such as first and second are only used to distinguish one entity or operation from another entity or operation, and do not necessarily require or imply any such actual relationship between these entities or operations or order. Moreover, the terms "including", "comprising" or any other variants thereof are intended to cover non-exclusive inclusion, such that a process, method, article, or device that includes a series of elements includes not only those elements, but also those that are not explicitly listed or also include elements inherent to this process, method, article or equipment. If there are no more restrictions, the elements defined by the sentence "including . . . " do not exclude the existence of other same elements in the process, method, article, or equipment that includes the elements.

It should be understood that when describing the structure of a component, when a layer or region is referred to as being "on" or "above" another layer or another region, the layer or region may be directly on the other layer or region, or indirectly on the other layer or region, for example, layers/components between the layer or region and another layer or another region. And, for example, when the component is reversed, the layer or region may be "below" or "under" the other layer or region. In the present disclosure, the term "electrical connection" refers to that two components are directly electrically connected with each other, or the two components are electrically connected via one or more other components.

Figure 2:
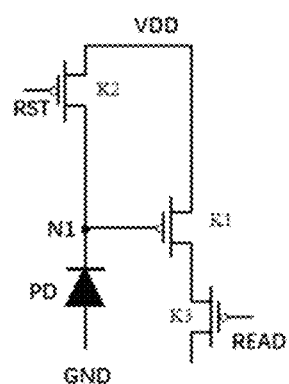
FIG. 2 illustrates a photosensitive circuit.

A display panel in existing technologies has a technical problem of inaccurate brightness adjustment. As shown in FIG. 1 illustrating a pixel circuit of a display panel in existing technologies, the pixel circuit includes a storage capacitor C and transistors T1-T7. This pixel circuit is a mature 7T1C pixel circuit and is able to drive a light-emitting device to work. Its workflow will not be described again. As shown in FIG. 2 illustrating a photosensitive circuit of a display panel in existing technologies, the photosensitive circuit includes a photosensitive device PD and transistors K1-K3. This photosensitive circuit is able to control the operation of the photosensitive device PD, and is a mature photosensitive circuit whose operation principle will not be described again. In the display panel, the photosensitive device is only used to detect the color temperature and/or the brightness of the ambient light in the environment where the display product is located, and the display brightness of the display panel is adjusted in real time based on the photosensitive parameters sensed by the photosensitive device. However, because a luminescent material of an organic light-emitting diode (OLED) has a lifespan that decreases after being lit for a long time, the color temperature trajectory of light emission of the OLED will have a certain offset. Therefore, the photosensitive parameters sensed by the ambient light sensor used to sense ambient light will have a certain error due to the luminous offset of the OLED itself, thus affecting the accuracy of the ambient light sensor's ability to sense the external environment. In existing technology, a light-blocking structure is usually designed to shield the impact of the OLED's own luminescence on the external ambient light sensed by the photosensitive device. Therefore, there is no technical solution in the existing technology that can independently monitor the offset of the color temperature and color trajectory of the OLED's own light emission.

The present disclosure provides a display panel and a display device to at least partially alleviate the above problems. In the present disclosure, first light-emitting devices and first photosensitive devices may be disposed in a non-display region of the display panel, to monitor the offset of the color temperature and color trajectory of light-emitting devices of the display panel. The present disclosure provides a display panel. The display panel may include a display region and a non-display region. The display panel may further include: a substrate; a driving array layer located on the substrate; a light-emitting device layer located on a side of the driving array layer away from the substrate; and a photosensitive device assembly. The driving array layer may include first pixel circuits in the non-display region and second pixel circuits located in the display region. The light-emitting device layer may include first light-emitting devices located in the non-display region and second light-emitting devices located in the display region. The first light-emitting devices may be electrically connected to the first pixel circuits, and the second light-emitting devices may be electrically connected to the second pixel circuits. The photosensitive device assembly may include first photosensitive devices and second photosensitive devices arranged in the driving array layer. An orthographic projection of one first photosensitive device toward the substrate may at least partially overlap an orthographic projection of one corresponding first light-emitting device toward the substrate, and the second photosensitive devices may be disposed in the display region.

In the present disclosure, the first pixel circuits located in the non-display region may drive the first light-emitting devices located in the non-display region to emit light, and the second pixel circuits located in the display region may drive the second light-emitting devices located in the display region to emit light. Therefore, the non-display region of the display panel may be provided with the second light-emitting devices capable of emitting light. The second light-emitting devices may not be used to display images, but may be used to simulate the light emission of the first light-emitting devices to facilitate detection of the offset of the color temperature and color trajectory of the first light-emitting devices of the display panel. The first photosensitive device arranged in the non-display region may detect the luminescence parameters of the first light-emitting devices, and the second photosensitive devices arranged in the display region may detect the photosensitive parameters of ambient light in the environment where the display panel is located. Therefore, the luminescence parameters detected by the first photosensitive devices may be used to determine the offset of the color temperature and color trajectory of light emission of the display product itself, and the ambient brightness of the display product may be determined based on the photosensitive parameters detected by the second photosensitive devices. With reference to the offset of the color temperature and color trajectory of the light-emitting devices of the display product itself, the brightness of the display product may be adjusted based on the ambient brightness, thereby eliminating the impact of the offset of the color temperature and color trajectory of the display product's own light-emitting devices on the brightness conditions, and improving the accuracy of brightness adjustment of the display product.

Figure 3:
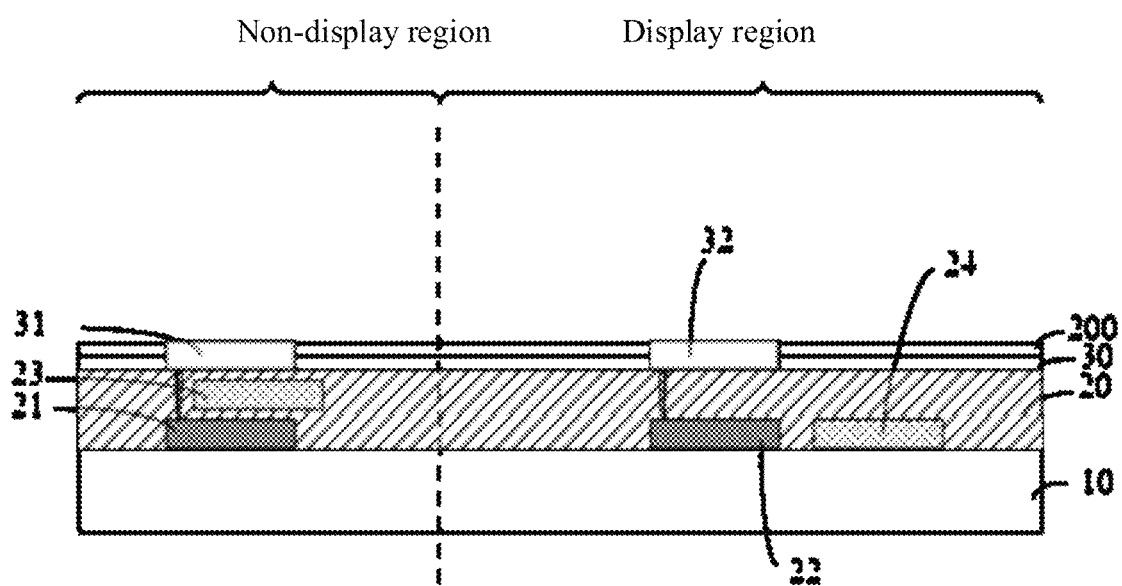
FIG. 3 illustrates a schematic structure of an exemplary display panel consistent with various disclosed embodiments in the present disclosure.

The present disclosure provides a display panel. As shown in FIG. 3, in one embodiment, the display panel may have a display region and a non-display region. The display panel may include a substrate 10, a driving array layer 20, first pixel circuits 21, second pixel circuits 22, a light-emitting device layer 30, first light-emitting devices 31, second light-emitting devices 32, first photosensitive devices 23, and second photosensitive devices 24.

The driving array layer 20 may be located on the substrate 10, and may include the first pixel circuits 21 located in the non-display region and the second pixel circuits 22 located in the display region.

A plurality of devices of the pixel circuits may be arranged in the driving array layer 20. The plurality of devices of the pixel circuits may be electrically connected according to the design of the pixel circuits.

In one embodiment, a black pixel define layer 200 (BPDL) with a light blocking function may also be set on one side of the light-emitting device layer 30 to achieve the effect of light blocking.

The substrate 10 may include a first base layer (made of a material including polyimide), a first barrier layer, a second barrier layer (made of a material including a-Si), and a second base layer (made of a material including polyimide) stacked in sequence. The substrate 10 may provide support for rest structural film layers arranged on it. In some embodiments, the substrate may be a rigid substrate, and the rigid substrate may be made of a material including glass. In some other embodiments, the substrate may also be a flexible substrate, and the flexible substrate may be made of a material including at least one of polyimide (PI), polyethylene terephthalate, polyethylene naphthalate, polyethylene, polyacrylate, polyetherimide, polycarbonate, polyarylester, or polyethersulfone.

The non-display region may include a dummy region. To ensure the uniformity of etching and evaporation, the display panel may be usually provided with some virtual pixel circuits and virtual light-emitting devices around the display region, and there may be no electrical connection between the virtual pixel circuits and the virtual light-emitting devices. Therefore, the virtual light-emitting devices may not emit light. In the present disclosure, at least a portion of the virtual light-emitting devices may be connected with the dummy pixel circuits, and the portion of the virtual light-emitting devices connected with the virtual pixel circuits may be set as the first light-emitting devices.

Figure 4:
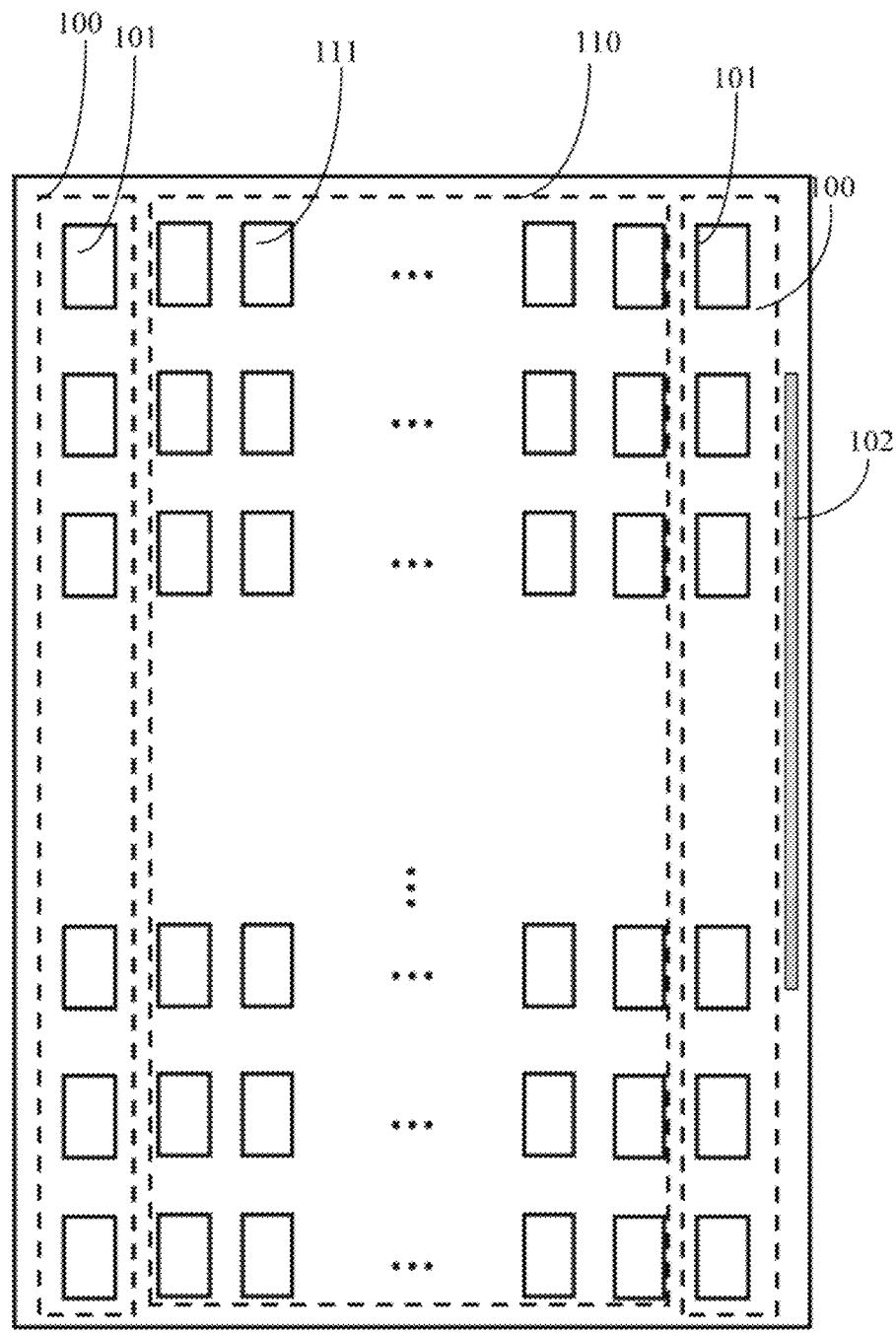
FIG. 4 illustrates an exemplary display panel consistent with various disclosed embodiments in the present disclosure.

In one embodiment shown in FIG. 4, the non-display region may include a dummy region 100. The first light-emitting devices may be disposed in the dummy region 100.

The dummy region 100 may be at least located on one side of the display region 110, and may be disposed on any side, or two sides of the display region 100. A plurality of virtual pixels 101 (pixels that do not emit light outwards) may be disposed in the dummy region 100. A plurality of real pixels 111 that are used to emit light outwards may be disposed in the display region. The display panel in FIG. 4 may further include driving circuits 102 disposed in a frame region of the display panel. The driving circuits 102 may include a shift register. The shift register may include a plurality of unit circuits connected in cascade. Each of the plurality of unit circuits from the first level to the last level may be connected with one corresponding pixel circuit, and may successively output clock signals to control the work of the corresponding pixel circuit to light up the corresponding pixel.

Figure 5:
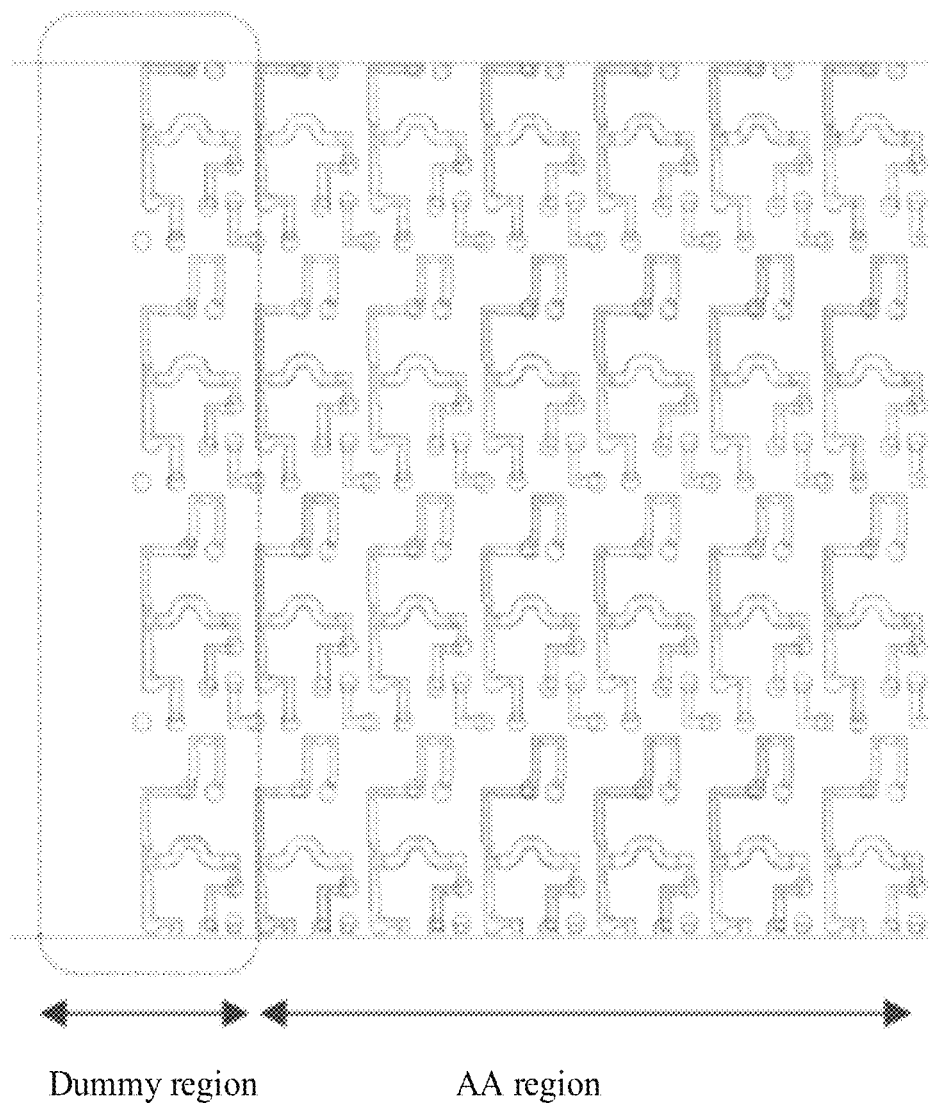
FIG. 5 illustrates a schematic structure of a dummy region in an exemplary display panel consistent with various disclosed embodiments in the present disclosure.
Figure 6:
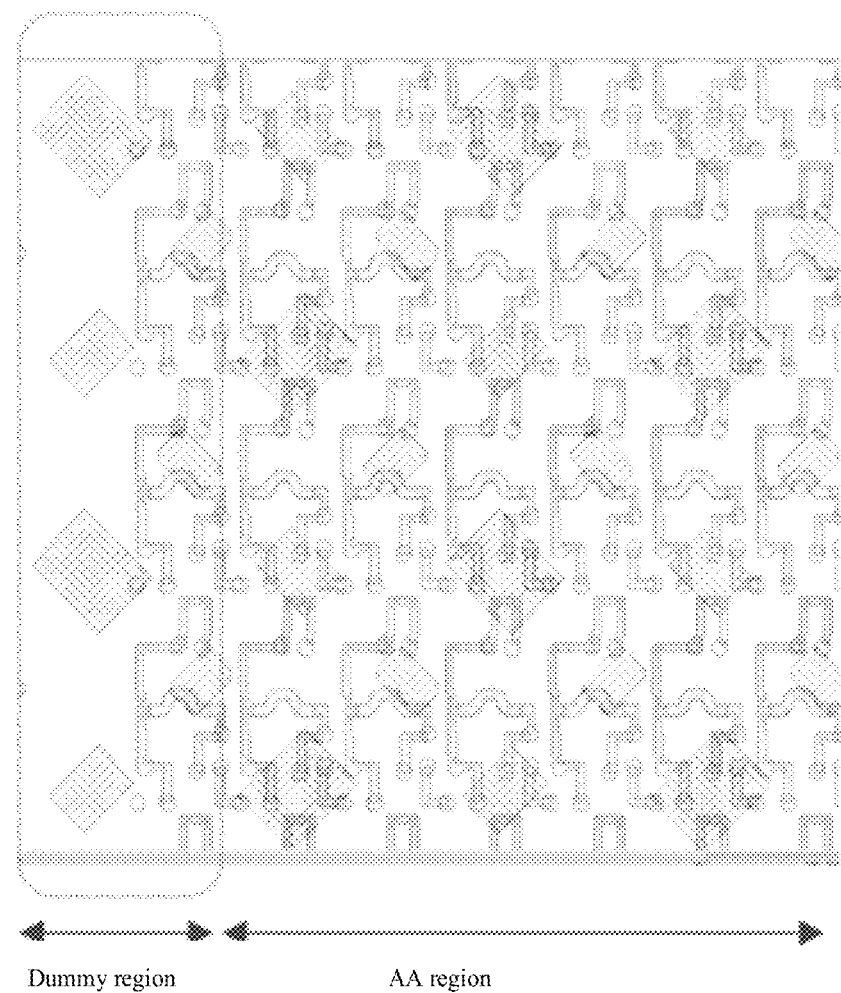
FIG. 6 illustrates another schematic structure of a dummy region in an exemplary display panel consistent with various disclosed embodiments in the present disclosure.
Figure 7:
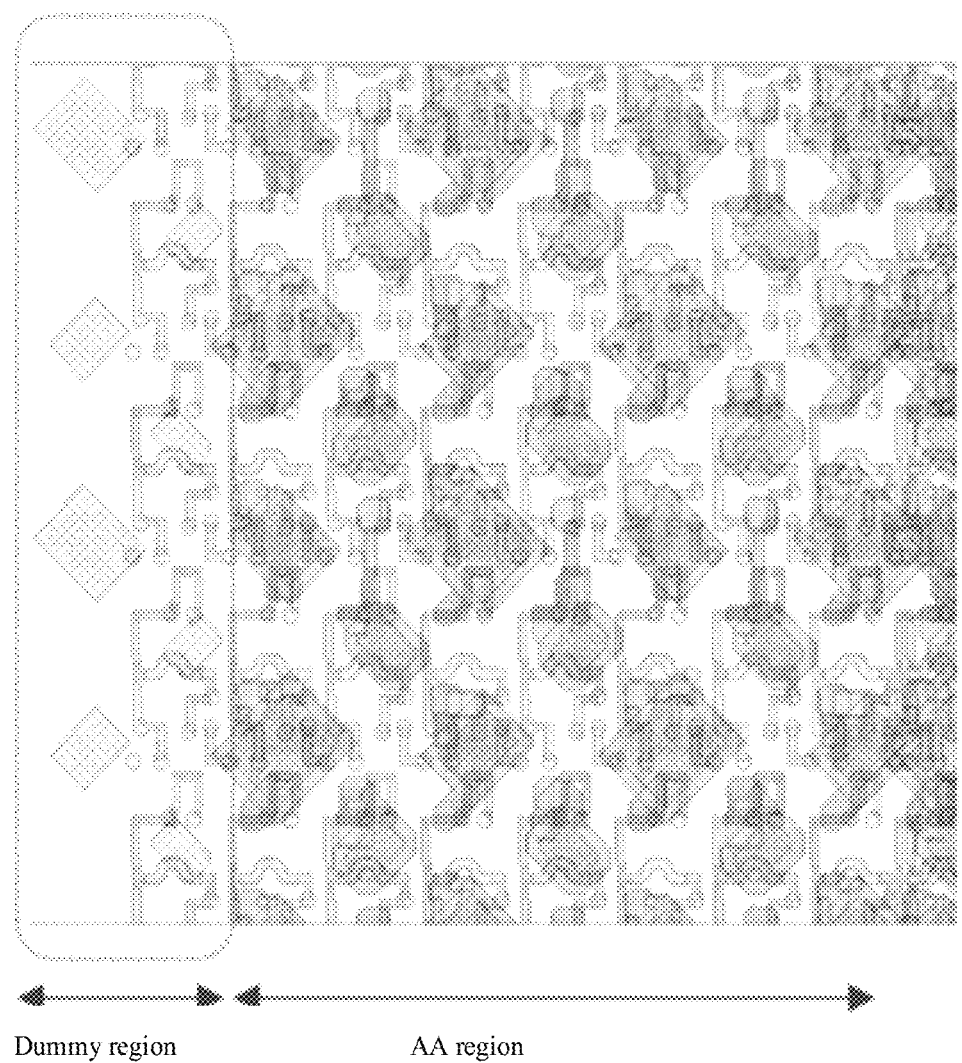
FIG. 7 illustrates another schematic structure of a dummy region in an exemplary display panel consistent with various disclosed embodiments in the present disclosure.

FIG. 5 is a schematic diagram of some film layers of the display panel. As shown in FIG. 5, the display panel may include an active layer. An active layer pattern same as the AA region (the display region) may be set in the dummy region, that is, the active layer may be disposed in both the dummy region and the AA region. As shown in FIG. 6, the pixel openings in the OLED mask layer that are the same as in the AA region (the display region) may be disposed in the dummy region, that is, both the dummy region and the AA region may include pixel openings. As shown in FIG. 7, the pixel circuits in the dummy region and the OLEDs in the pixel openings may be not electrically connected, but the pixel circuits in the AA region (the display region) and the OLEDs in the pixel openings may be electrically connected through the anode connection lines, such the pixels in the dummy region are virtual pixels that do not emit light and the pixels in the AA region are used to emit light.

The light-emitting device layer 30 may be located on the side of the driving array layer 20 away from the substrate 10, and the light-emitting device layer 30 may include the first light-emitting devices 31 located in the non-display region, and second light-emitting devices 32 located in the display region. The first light-emitting devices 31 may be electrically connected with the first pixel circuits 21, and the second light-emitting devices 32 may be electrically connected with the second pixel circuits 22.

The second light-emitting device 32 set in the display region may emit light for the normal display of the display panel, while the first light-emitting devices 31 set in the non-display region may emit light suitable for characterizing the offset of the color temperature color trajectory of the light-emitting devices of the display panel, and may not be used for display but for simulating the light emission of the first light-emitting devices. Therefore, it may be convenient to detect the offset of the color temperature color trajectory of the first light-emitting devices 31 of the display panel.

The photosensitive device assembly may include the first photosensitive devices 23 and the second photosensitive devices 24 arranged in the driving array layer 20. An orthographical projection of one first photosensitive device 23 towards the substrate 10 may at least partially overlap with an orthographical projection of one corresponding first light-emitting device 31 towards the substrate 10. The second photosensitive devices 24 may be arranged in the display region.

An orthographical projection of one first photosensitive device 23 towards the substrate 10 may at least partially overlap with an orthographical projection of one corresponding first light-emitting device 31 towards the substrate 10. Therefore, the first photosensitive device 23 may be able to receive the light emitted by the corresponding first light-emitting device 3 to achieve detection of the light-emitting parameter of the corresponding first light-emitting device 31. That is, the offset of the color temperature and color trajectory of the corresponding light-emitting device in the display panel may be independently monitored. The second photosensitive devices 24 disposed in the display region, may be able to detect the parameters of the ambient light. An orthographic projection of one second photosensitive device 24 towards the substrate 10 may not overlap with an orthographic projection of one corresponding second light-emitting device 32 towards the substrate 10, such that the parameters of the ambient light monitored by the second photosensitive device 24 are not affected by the light emission of the corresponding second light-emitting device 32. Thus, the independent monitor of the luminescence of the light-emitting devices of the display panel and the independent monitoring of the ambient light may be realized, which is convenient to accurately adjust the brightness of the display panel.

In one embodiment, the first light-emitting devices 31, the first photosensitive devices 23 and the first pixel circuits 21 may be all arranged in the non-display region of the display panel, such that the original non-display region (such as the dummy region) is utilized. The first pixel circuits 21 in the non-display region (such as the dummy region) may be electrically connected with the first light-emitting devices 31, to achieve light emission. The first light-emitting devices 31 may be not used for display, and may be used to characterize the offset of the color temperature and color trajectory of the second light-emitting devices 32 of the display panel. Therefore, while the resolution of the display panel itself may not change or the luminous visual effect of the display panel itself may not be affected, that is, display density of the display panel may not change and the frame region may not increase, real-time monitoring of the change of the color temperature or brightness of the OLED material of the display panel and the change of the color temperature and brightness of the external ambient light may be realized.

In the present disclosure, the first pixel circuits 21 located in the non-display region may be able to drive the first light-emitting devices 31 located in the non-display region to emit light, and the second pixel circuits 22 located in the display region may drive the second light-emitting devices 32 located in the display region to emit light. Therefore, the non-display region of the display panel may be used to accommodate the first light-emitting devices 31 for simulating light emission of pixels in the normal display region. The offset of the color temperature color and color trajectory of the light-emitting devices of the display product may be determined by detecting the light-emitting parameters of the first light-emitting devices 31 detected by the first photosensitive devices 23. The ambient brightness of the display product may be determined according to the photosensitivity parameters of the ambient light of the display panel detected by the second photosensitive devices 24. Correspondingly, the brightness of the display product may be adjusted according to the offset of the color temperature and color trajectory of the light-emitting devices and the ambient brightness condition, to eliminate the influence of the offset of the color temperature and color trajectory of the light-emitting devices on the brightness adjustment and improve the accuracy of the brightness adjustment of the display product.

Figure 8:
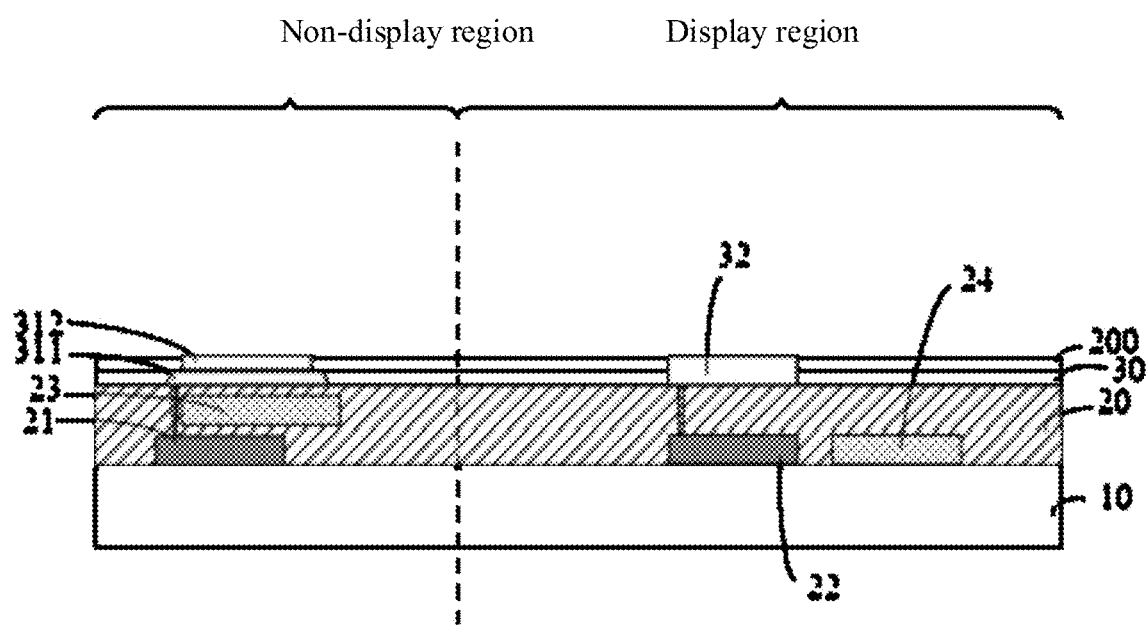
FIG. 8 illustrates a schematic structure of another exemplary display panel consistent with various disclosed embodiments in the present disclosure.

In one embodiment shown in FIG. 8, one first light-emitting device 31 may include a first anode 311 and a first light-emitting body 312.

The first anode 311 may be located on a side of the first light-emitting body 312 close to the substrate 10, and the first anode 311 may be electrically connected with the first light-emitting body 312.

The first anode 311 may be a transparent electrode, and the first light-emitting body 312 may be an organic luminescent film that is able to emit light. Therefore, the light emitted by the first light-emitting body 312 may pass through the first anode 311, to facilitate one corresponding first photosensitive device 23 to receive the light emitted by the first light-emitting body 312 and realize the monitor of the light-emitting parameters of the first light-emitting device 31.

For example, in one embodiment, the first anode 311 may be formed using a half-tone mask plate, which may have a light-transmitting region.

The driving array layer 20 may include the first pixel circuits 21 and each first pixel circuit 21 may be electrically connected to one corresponding first anode 311.

One first pixel circuit 21 may transmit driving current to one corresponding first light-emitting body 312 through one corresponding first anode 311 to drive the corresponding first light-emitting body 312 to work.

In this embodiment, the first anode 311 may be a transparent electrode, such that the corresponding first photosensitive device 23 is able to receive the light emitted by the first light-emitting body 312 and the light-emitting parameters of the first light-emitting device 31 may be monitored.

In one embodiment, as shown in FIG. 8, an orthographic projection of one first light-emitting device 31 toward the substrate 10 may be located inside an orthographic projection of one corresponding first photosensitive device 23 toward substrate 10.

In this embodiment, the orthographic projection of the first light-emitting device 31 toward the substrate 10 may be configured to be located inside the orthographic projection of the corresponding first photosensitive device 23 toward the substrate 10, such that the first photosensitive device 23 is able to receive the light emitted by the first light-emitting device 31 and the light-emitting parameters of the first light-emitting device 31 may be better monitored.

Figure 9:
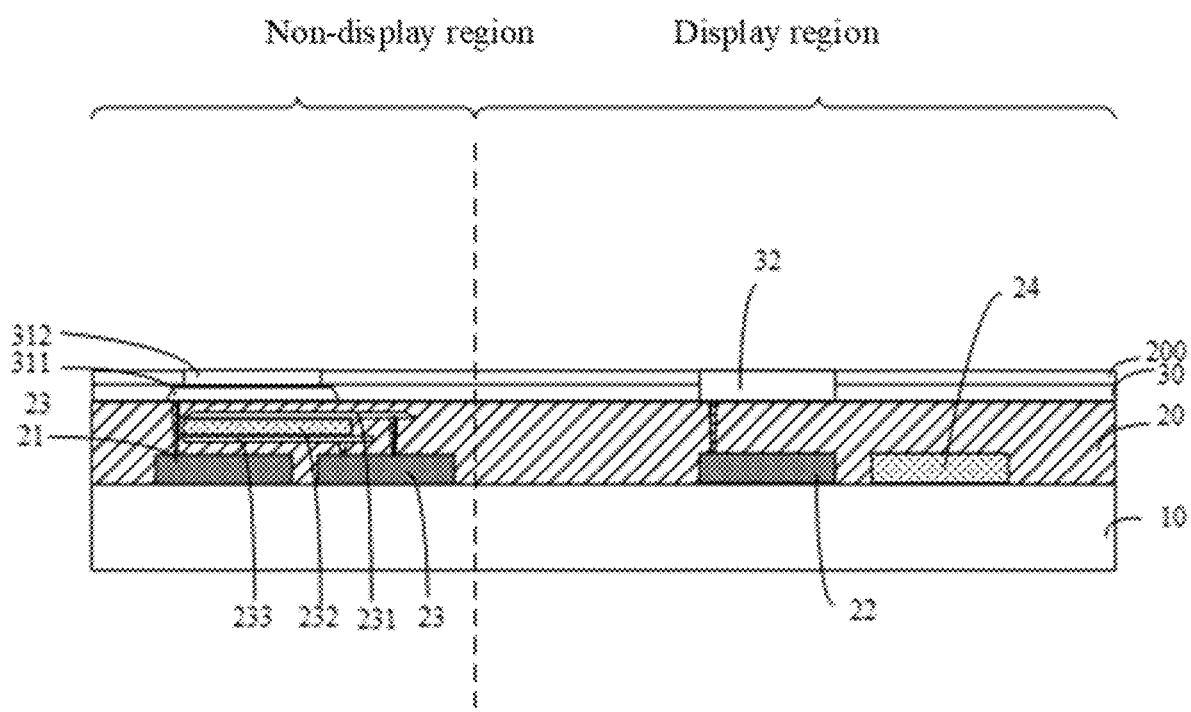
FIG. 9 illustrates a schematic structure of another exemplary display panel consistent with various disclosed embodiments in the present disclosure.

In one embodiment, as shown in FIG. 9, one first photosensitive device may include a first photosensitive electrode 231, a first photosensitive body 232, and a second photosensitive electrode 233.

The first photosensitive electrode 231 may be located on a side of the first photosensitive body 232 close to one corresponding first light-emitting device 31, and the first photosensitive electrode 231 may be electrically connected with the first photosensitive body 232.

The first photosensitive electrode 231 may be a transparent electrode, such that the light emitted by the corresponding first light-emitting device 31 is able to reach the first photosensitive body 232 through the first photosensitive electrode 231 and the first photosensitive device 23 is able to monitor the luminous parameters of the corresponding first light-emitting device 31.

The second photosensitive electrode 233 may be located on another side of the first photosensitive body 232 away from the corresponding first light-emitting device 31, and the second photosensitive electrode 233 may be electrically connected with the first photosensitive body 232.

The second photosensitive electrode 233 may be a non-transparent electrode, to block the light emitted by the corresponding first light-emitting device 31 and prevent the light emitted by the corresponding first light-emitting device 31 from affecting transistors in the first photosensitive control circuit or the first pixel circuit 21 below.

The driving array layer 20 may further include first photosensitive control circuits. One first photosensitive control circuit may be electrically connected with the first photosensitive electrode 231 and the second photosensitive electrode 233 of one corresponding first photosensitive device respectively, for providing driving current to the first photosensitive body 232 through the first photosensitive electrode 231 and the second photosensitive electrode 233 to control the work of the first photosensitive body 232.

The first photosensitive control circuit may be a circuit shown in FIG. 2, which includes a plurality of transistors and is able to control the work of the corresponding photosensitive device.

In the present embodiment, the first photosensitive device 23 may include the first photosensitive r electrode 231, the first photosensitive body 232, and the second photosensitive electrode 233, and the corresponding first photosensitive control circuit may be provided. Therefore, the first photosensitive device 23 may be controlled. The first photosensitive electrode 231 may be designed as a transparent electrode. Thus, the light emitted by the corresponding first light-emitting device 31 may reach the first photosensitive body 232 through the first photosensitive electrode 231, and the first photosensitive device 23 may monitor the luminous parameters of the corresponding first photosensitive device 31.

In one embodiment shown in FIG. 9, an orthographic projection of the first photosensitive body 232 toward the substrate 10 may be located inside an orthographic projection of the second photosensitive electrode 233 toward the substrate 10.

Light may affect the electrical conductivity of an active layer (for example, a channel region) of each thin film transistor in the corresponding first photosensitive control circuit 25 or the corresponding first pixel circuit 21, resulting in the unstable working state of each thin film transistor and affecting the working stability of the corresponding first photosensitive control circuit 25 or the corresponding first pixel circuit 21. In this embodiment, the orthographic projection of the first photosensitive body 232 towards substrate 10 may be located inside the orthographic projection of the second photosensitive electrode 233 towards substrate 10, such that the second photosensitive electrode 233 is able to completely block the light emitted by the corresponding first light-emitting devices 31 to prevent the light emitted by the first light-emitting device 31 from affecting transistors in the first photosensitive control circuit 25 or the first pixel circuit 21 below.

Figure 10:
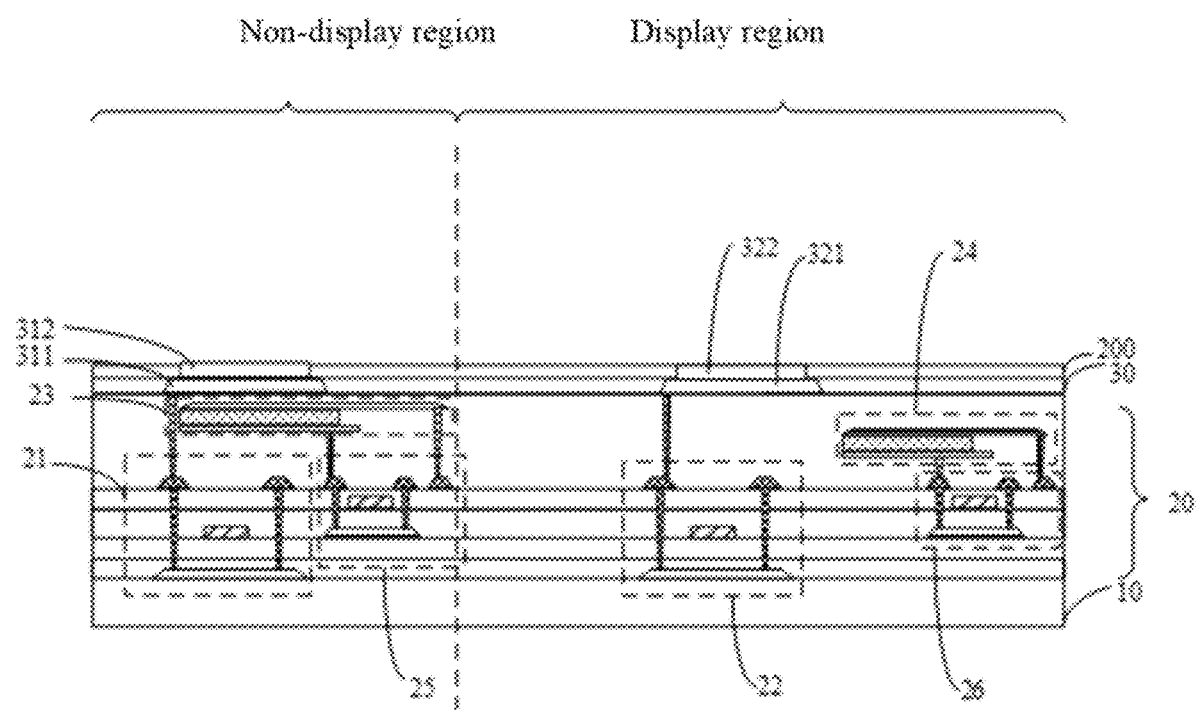
FIG. 10 illustrates a schematic structure of another exemplary display panel consistent with various disclosed embodiments in the present disclosure.

In one embodiment shown in FIG. 10, the driving array layer 20 may include the first pixel circuits 21, the second pixel circuits 22, the first photosensitive control circuits 25 and the second photosensitive control circuits 26.

Each of the first pixel circuits 21 or the second pixel circuits 22 may include multiple transistors and capacitors, and the specific circuits may refer to the circuit diagram shown in FIG. 1. Each of the first photosensitive control circuits 25 or the second photosensitive control circuits 26 may include multiple transistors, and the specific circuits may refer to the circuit diagram shown in FIG. 2.

A source and a drain of each transistor in the first pixel circuits 21, the second pixel circuits 22, the first photosensitive control circuits 25 and the second photosensitive control circuits 26 may be formed in the same layer.

A gate of each transistor in the first photosensitive control circuits 25 and the second photosensitive control circuits 26 may be formed in the same layer, and an active region of each transistor in the first photosensitive control circuits 25 and the second photosensitive control circuits 26 may be formed in the same layer.

A gate of each transistor in the first pixel circuits 21 and the second pixel circuits 22 may be formed in the same layer, and an active region of each transistor in the first pixel circuits 21 and the second pixel circuits 22 may be formed in the same layer.

The source and drain of each transistor in the first pixel circuits 21 and the second pixel circuits 22 may be connected with their corresponding source region and drain region respectively through corresponding through holes, and the source and drain of each transistor in the first photosensitive control circuits 25 and the second photosensitive control circuits 26 may be connected with their corresponding source region and drain region respectively through corresponding through holes.

The present embodiment provides detailed circuit structures of the first pixel circuits 21, the second pixel circuits 22, the first photosensitive control circuits 25, and the second photosensitive control circuits 26, which are disposed in the pixel driving layer to drive the light-emitting devices and the photosensitive devices to operate.

Figure 11:
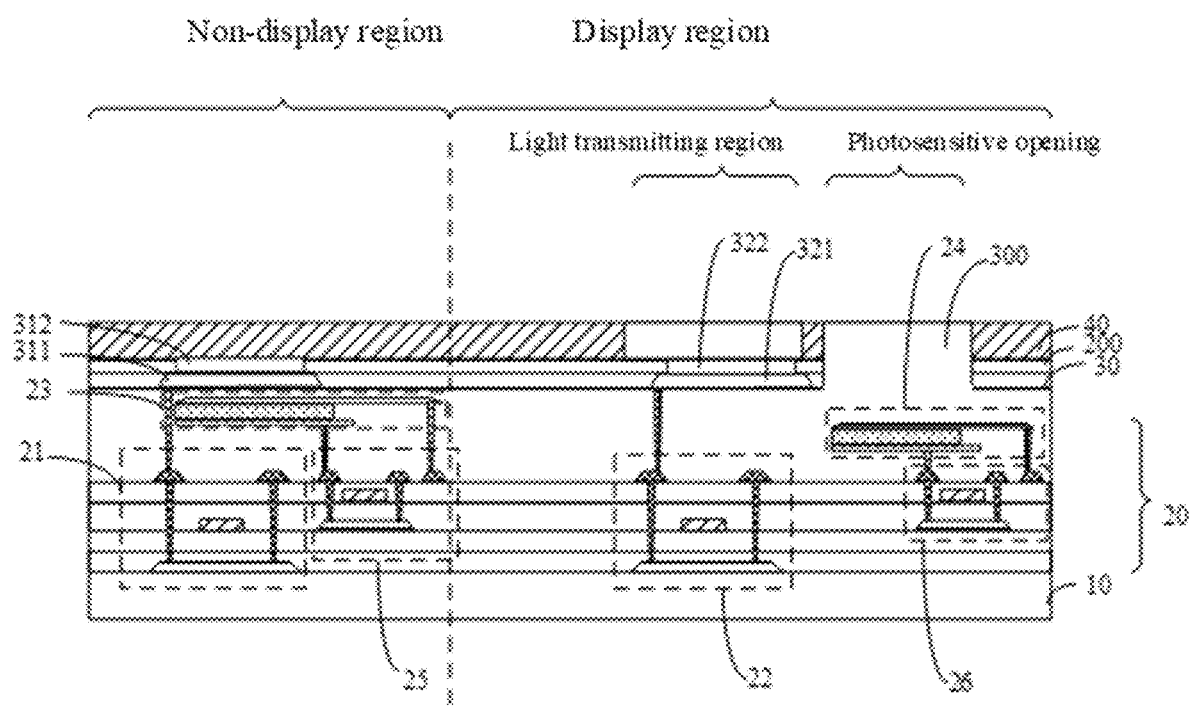
FIG. 11 illustrates a schematic structure of another exemplary display panel consistent with various disclosed embodiments in the present disclosure.

In one embodiment shown in FIG. 11, the display panel may further include a light-blocking layer 40. The light-blocking layer 40 may be located on the side of the light-emitting device layer 30 away from the driving array layer 20, and the light-blocking layer 40 may include a transparent region and a non-transparent region.

For example, in one embodiment, the light-blocking layer 40 may replace a polarizer with a color film on encapsulation (COE) technology combining a color filter film and a black matrix. That is, the display panel may further include a film encapsulation layer located on the side of the light-emitting device layer away from the substrate. The light-blocking layer 40, for example, may be located on a side of the film package layer away from the light-emitting device layer. The transmittance of the polarizer is about 43.5%, and the transmittance of the color filter film is able to reach more than 70%. Therefore, the light utilization rate may be significantly improved, and the power consumption of the screen body may be significantly reduced. Further, the flexibility of the color filter film may be high. When the display panel is a flexible or folded display panel, using the color filter film to replace the polarizer, may be beneficial to the bending of the flexible display panel.

In this embodiment, the effect of blocking the external ambient light may be realized by setting the light-blocking layer 40 (for example, a black matrix layer). The second light-emitting devices 32 may be able to emit light outward and realize normal display by setting a light transmitting region in the corresponding region of the light-blocking layer 40. By setting the non-transparent region in the corresponding region of the light-blocking layer 40, the first light-emitting devices 31 may be blocked from emit light outward, such that the first light-emitting devices 31 may be not used for display but may be used to characterize the offset of the color temperature and color trajectory of the second light-emitting devices 32 of the display panel. Therefore, while the resolution of the display panel itself may not change or the luminous visual effect of the display panel itself may not be affected, that is, whole the display density of the display panel may not change and the frame region may not increase, real-time monitoring of the change of the color temperature or brightness of the OLED material of the display panel and the change of the color temperature and brightness of the external ambient light may be realized.

In one embodiment shown in FIG. 10 and FIG. 11, one second light-emitting device may include a second anode 321 and a second light-emitting body 322.

The second anode 321 may be located on a side of the second light-emitting body 322 close to the substrate 10, and the second anode 321 may be electrically connected with the second light-emitting body 322.

In one embodiment, the light-emitting device layer also includes cathodes (not shown in the figure), and the first light-emitting body and the second light-emitting body may be located between the corresponding anode and cathode, respectively.

The second anode 321 may be a non-transparent electrode. The second light-emitting body 322 may be an OLED film layer that is able to emit light. Therefore, the second light-emitting body 322 may be blocked by the second anode 321 to prevent the light emitted by the second light-emitting body 322 from affecting the transistors in the second pixel circuit 22 below.

The driving array layer 20 may include the plurality of second pixel circuits 22. One second pixel circuit 22 may be electrically connected to one corresponding second anode 321. The second pixel circuit 22 may transmit driving current to the corresponding second light-emitting body 322 through the corresponding second anode 321 to drive the corresponding second light-emitting body 322.

Figure 12:
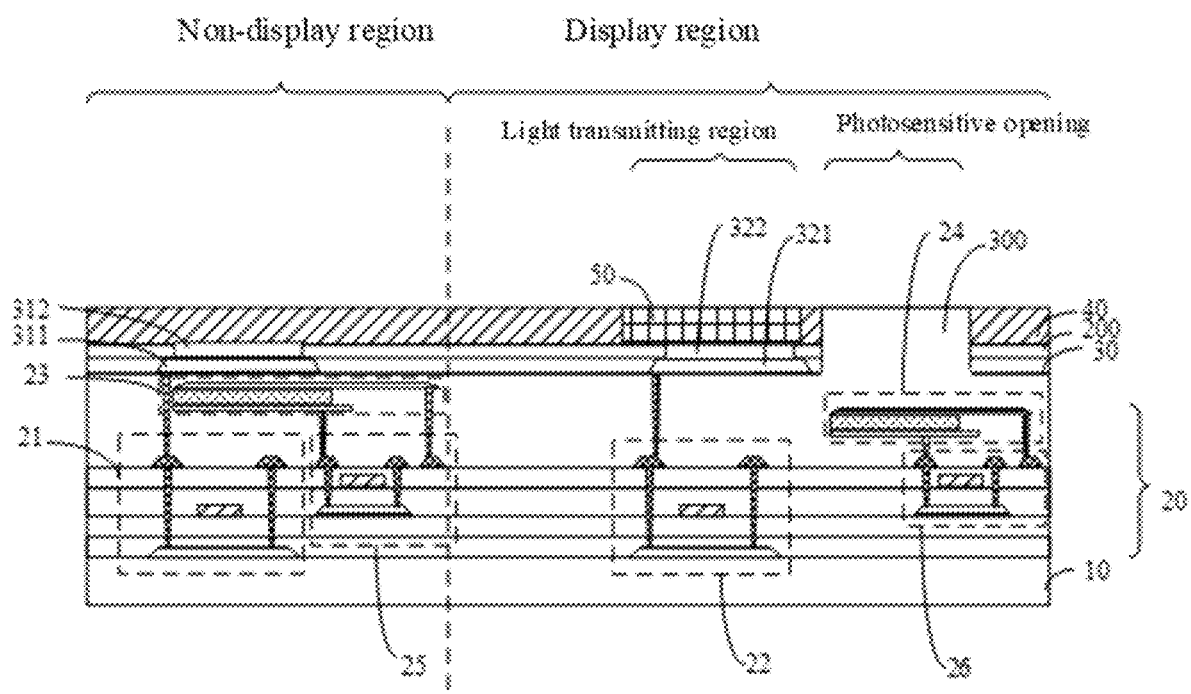
FIG. 12 illustrates a schematic structure of another exemplary display panel consistent with various disclosed embodiments in the present disclosure.

In one embodiment shown in FIG. 12, the display panel may further include a color film layer. The color film layer may include color blockers 50 corresponding to the second light-emitting devices. The color blockers 50 may be located in the light transmission regions of the light-blocking layer 40 corresponding to the second light-emitting devices, and the light emitted by the second light-emitting devices may be filtered through the color blockers 50, such that the color of the second light-emitting devices may be purer.

One color blocker 50 may be one of red, green, or blue blockers.

In one embodiment, as shown in FIG. 11, the light-emitting device layer 30 may be provided with photosensitive openings 300 located in the display region.

An orthographic projection of one photosensitive opening 300 towards the substrate 11 may be located inside an orthographic projection of one corresponding light-transmitting region of the light-blocking layer 40 towards the substrate 10.

In the present embodiment, an orthographic projection of one photosensitive opening 300 towards the substrate 11 may be located inside an orthographic projection of one corresponding light-transmitting region of the light-blocking layer 40 towards the substrate 10. Therefore, the external ambient light may reach one second photosensitive device 24 through one corresponding photosensitive opening 300, which is convenient for the second photosensitive device 24 to monitor the external ambient light.

The second photosensitive devices may be communicated with the outside world, and the corresponding photosensitive openings 300 may be provided in each film layer separated from the outside world, to facilitate the external ambient light to reach the second photosensitive devices 24.

In one embodiment, a filter film layer may be covered on the side of the photosensitive openings 300 close to the outside. The second photosensitive devices 24 may be light sensors, which are able to sensitively sense the light energy of the received light and convert the light energy into electrical signals. Since the second photosensitive devices 24 are ambient light sensors, the filter film layer may need to be set. The filter film layer may be an infrared cut-off film. The infrared light incident on the ambient light sensors may interfere with the beam sensed by the ambient light sensors. Therefore, the filter film layer may be usually set for infrared cut-off filtering to prevent the interference of infrared light and improve the accuracy of the sensed ambient light.

For one second photosensitive device 24, a corresponding second photosensitive control circuit 26 may be also provided to control it.

In the present embodiment, the photosensitive openings 30 may be provided such that the external ambient light may reach one second photosensitive device 24 through one corresponding photosensitive opening 300 and the second photosensitive device 24 may be able to monitor the external ambient light.

In one embodiment shown in FIG. 10, an orthographic projection of one second light-emitting device 32 towards substrate 10 may be located inside an orthographic projection of one corresponding light-transmitting region of the light-blocking layer 40 towards substrate 10.

In this embodiment, an orthographic projection of one second light-emitting device 32 towards substrate 10 may be located inside an orthographic projection of one corresponding light-transmitting region of the light-blocking layer 40 towards substrate 10, such that the light-blocking layer 40 may not affect the external display of the second light-emitting device 32.

Figure 13:
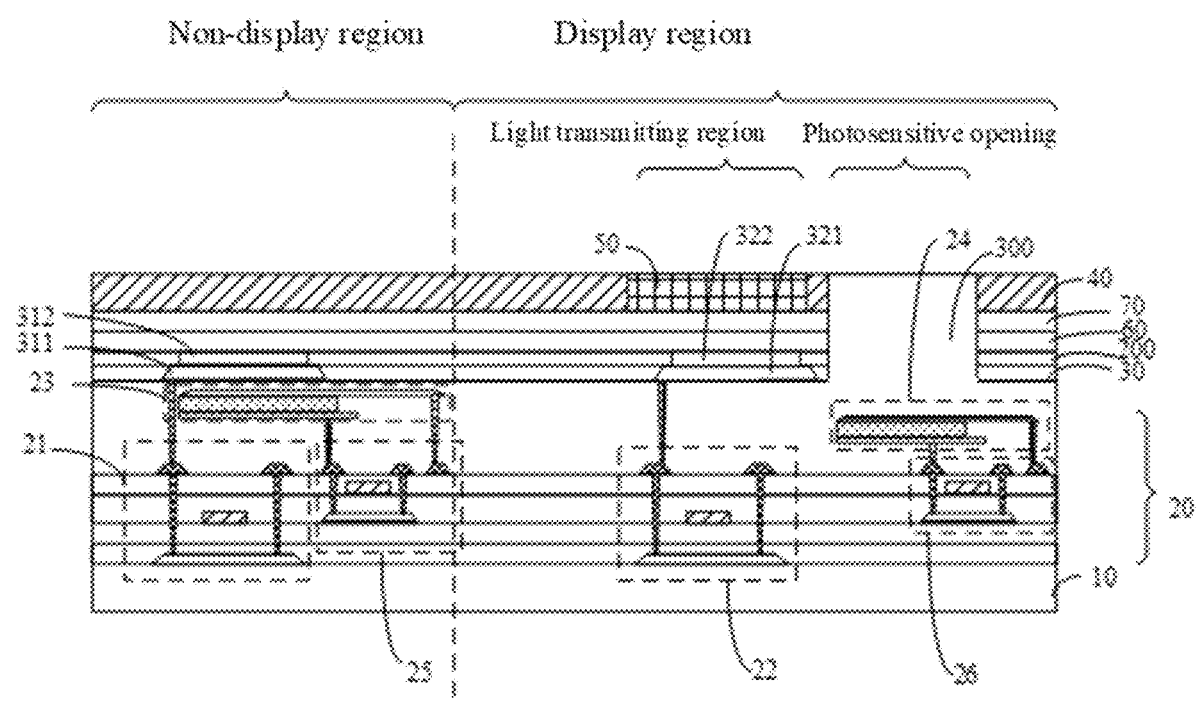
FIG. 13 illustrates a schematic structure of another exemplary display panel consistent with various disclosed embodiments in the present disclosure.

In one embodiment shown in FIG. 13, the display panel may further include a package structure layer 60 and a touch function layer 70.

The package structure layer 60 may be located on a side of the light-blocking layer 40 away from the light-emitting device layer 30.

In one embodiment, the package layer may be a thin film package layer located on the cathode layers of the light-emitting devices, and may include a first inorganic package layer, a first organic package layer, and a second inorganic package layer arranged sequentially along the direction away from the substrate 10. In other optional embodiments of the present disclosure, the package structure layer may include any number of layered organic and inorganic materials as required. At least one layer of organic material and at least one layer of inorganic material may be alternately deposited, and the lowest layer and the uppermost layer may be made of inorganic materials.

The touch function layer 70 may be located on a side of the package structure layer 60 away from the light-blocking layer 40.

In one embodiment, the touch function layer 70 may include a touch insulation layer, a touch electrode layer, etc., which are able to realize the touch function of the display panel.

Figure 14:
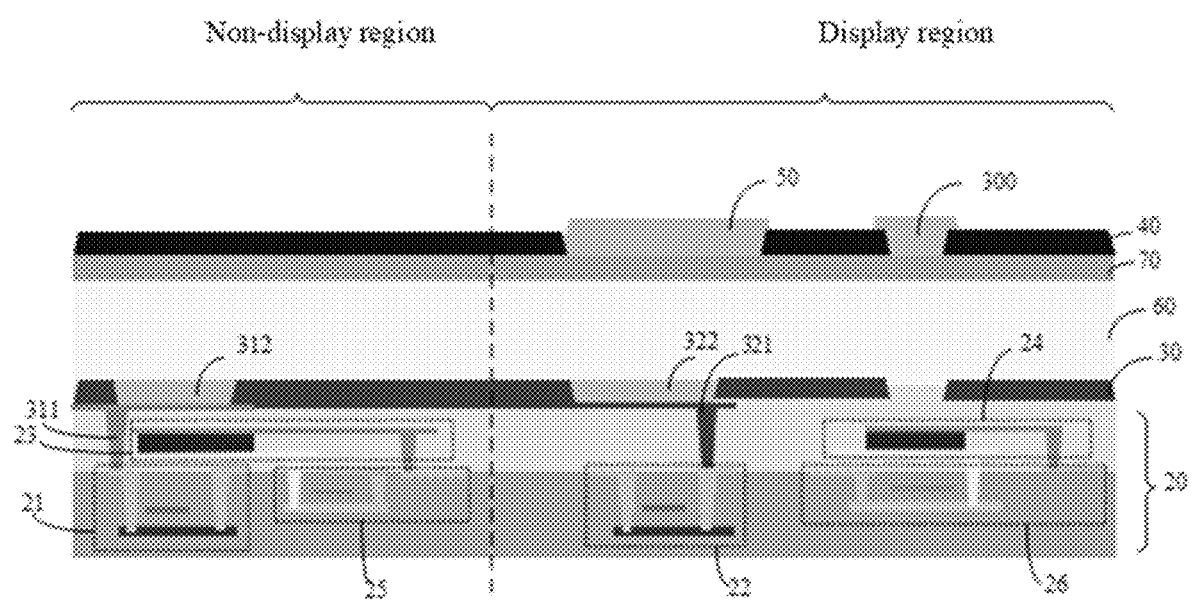
FIG. 14 illustrates a cross-sectional view of an exemplary display panel consistent with various disclosed embodiments in the present disclosure.

In the display panel shown in FIG. 14 which is a structure of a display panel, through the design of package structure layer 60 and the touch function layer 70, to ensure the basic function of the display panel. By using the virtual pixel region in the non-display region of the display panel to set the virtual pixels, the pixels in the virtual display region may be not used for display, and may be used to detect the offset of the color temperature and color trajectory of the OLEDs of the display panel. Therefore, while the resolution of the display panel itself may not change or the luminous visual effect of the display panel itself may not be affected, that is, whole the display density of the display panel may not change and the frame region may not increase, real-time monitoring of the change of the color temperature or brightness of the OLED material of the display panel and the change of the color temperature and brightness of the external ambient light may be realized.

In some embodiments, the display panel may further include driving circuits. The driving chips may be connected with the first pixel circuits and the second pixel circuits respectively, and may be used to control the working state synchronization of the first light-emitting device and the second light-emitting device through the first pixel circuits and the second pixel circuits. The device parameters of the first light-emitting devices and the second light-emitting devices may be the same.

The driving chips may be used to control the synchronization of the working states of the first light-emitting devices and the second light-emitting devices, and the device parameters of the first light-emitting devices and the second light-emitting devices may be the same. Therefore, the attenuation of the first light-emitting devices and the second light-emitting devices may be synchronous, and the offset of the color temperature and color trajectory of the first light-emitting devices may characterize the offset of the color temperature and color trajectory of the second light-emitting devices of the display panel, so that the color temperature color track offset of the first light-emitting device can be monitored. Therefore, the offset of the color temperature and color trajectory of the second light-emitting devices of the display panel may be obtained by monitoring the offset of the color temperature and color trajectory of the first light-emitting devices, to monitor the change of the color temperature and brightness of the OLED material of the display panel.

In this embodiment, by controlling the synchronization of the working states of the first light-emitting devices and the second light-emitting devices, the change of the color temperature and brightness of the OLED materials of the display panel may be better monitored.

Figure 15:
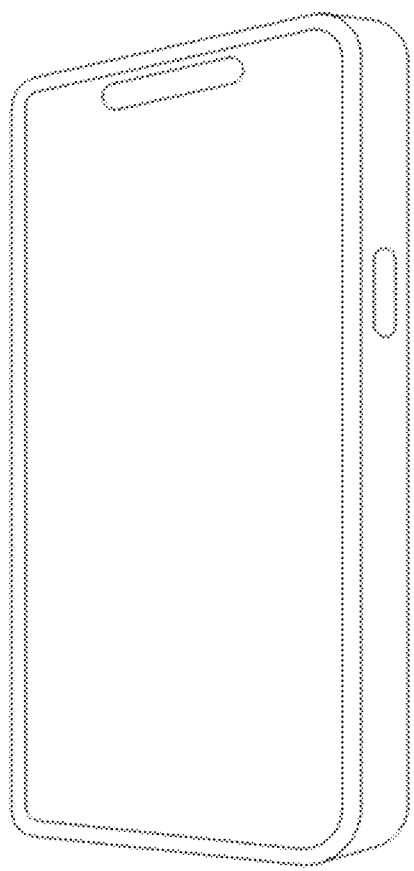
FIG. 15 illustrates an exemplary display device consistent with various disclosed embodiments in the present disclosure.

The present disclosure also provides a display device. In one embodiment shown in FIG. 15, the display device may include a display panel provided by various embodiments of the present disclosure. The display device provided by the present disclosure may have similar advantages as the display panel provided by various embodiments of the present disclosure.

In various embodiments, the display device may be a cell phone or another electronic product with a display function, including but not limited to, a television, a laptop computer, a tabletop computer, a tablet, a digital camera, a smart bracelet, smart glasses, a vehicle computer, an industry control device, a medical display panel, or a smart interactive terminal. The present disclosure has no limit on this.

In the present disclosure, relational terms such as "first" and "second" are only used to distinguish one entity or operation from another entity or operation, and do not necessarily require or imply that there is a relationship between these entities or operations. There is no such actual relationship or sequence. Furthermore, the terms "comprises", "include", or any other variations thereof are intended to cover a non-exclusive inclusion such that a process, method, article, or apparatus that includes a list of elements includes not only those elements, but also those not expressly listed, or elements inherent to the process, method, article or equipment. Without further limitation, an element defined by the statement "comprises a . . . " does not exclude the presence of additional identical elements in a process, method, article, or apparatus that includes the stated element.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel having a display region and a non-display region, comprising:
   a substrate;
   a driving array layer on the substrate, including first pixel circuits located in the non-display region and second pixel circuits located in the display region;
   a light-emitting device layer on a side of the driving array layer away from the substrate, including first light-emitting devices located in the non-display region and second light-emitting devices located in the display region, wherein the first light-emitting devices are electrically connected with the first pixel circuits respectively and the second light-emitting devices are electrically connected with the second pixel circuits respectively; and
   a photosensitive device assembly including first photosensitive devices and second photosensitive devices arranged in the driving array layer, wherein an orthographic projection of one first photosensitive device to the substrate is at least partially overlapped with an orthographic projection of one corresponding first light-emitting device to the substrate, and the second photosensitive devices are arranged in the display region.

2. The display panel according to claim 1, wherein:
   one first light-emitting device includes a first anode and a first light-emitting body;
   the first anode is located on a side of the first light-emitting body close to the substrate, and is electrically connected with the first light-emitting body;
   the first anode is a transparent electrode;
   the first pixel circuits are disposed in the driving array layer; and
   the first anode is electrically connected to one corresponding first pixel circuit.

3. The display panel according to claim 2, wherein:
   an orthographic projection of one first light-emitting device to the substrate is located within an orthographic projection of one corresponding first photosensitive device to the substrate.

4. The display panel according to claim 3, wherein:
   one first photosensitive device includes a first photosensitive electrode, a first photosensitive body, and a second photosensitive electrode;
   the first photosensitive electrode is located on a side of the first photosensitive body close to one corresponding first light-emitting device, and is electrically connected with the first photosensitive body, wherein the first photosensitive electrode is a transparent electrode;

the second photosensitive electrode is located on another side of the first photosensitive body away from the corresponding first light-emitting device, and is electrically connected with the first photosensitive body, wherein the second photosensitive electrode is a non-transparent electrode;

the driving array layer further includes first photosensitive control circuits electrically connected with the first photosensitive electrode and the second photosensitive electrode respectively to provide driving currents to the first photosensitive body through the first photosensitive electrode and the second photosensitive electrode to control operation of the first photosensitive body.

5. The display panel according to claim 4, wherein:
the driving array layer includes an active layer, a gate insulator layer, a gate layer, a first conductive layer and a second conductive layer arranged sequentially away from the substrate;
the second conductive layer includes a source and a drain of each transistor in the first pixel circuits, the second pixel circuits, and the first photosensitive control circuits;
the first conductive layer includes a gate of each transistor in the first photosensitive control circuits;
the gate layer includes a gate of each transistor in the first pixel circuits and the second pixel circuits, and an active region of each transistor in the first photosensitive control circuits the active layer includes an active region of each transistor in the first pixel circuits and the second pixel circuits;
the source and drain of each transistor in the first pixel circuits and the second pixel circuits are respectively connected with corresponding source and drain regions of the active layer through corresponding through holes; and
the source and drain of each transistor in the first photosensitive control circuits are respectively connected with corresponding source and drain regions of the gate layer through corresponding through holes.

6. The display panel according to claim 4, wherein:
an orthographic projection of one first photosensitive body to the substrate is located within an orthographic projection of one corresponding second photosensitive electrode to the substrate.

7. The display panel according to claim 1, further including a light-blocking layer, wherein:
the light-blocking layer is located on a side of the light-emitting device layer away from the driving array layer, and the light-blocking layer includes transparent regions and non-transparent regions.

8. The display panel according to claim 7, wherein:
one second light-emitting device includes a second anode and a second light-emitting body;
the second anode is located on a side of the second light-emitting body close to the substrate, and the second anode is electrically connected with the second light-emitting body;
the second anode is a non-transparent electrode;
the second pixel circuits are disposed in the driving array layer and the second anode is electrically connected to one corresponding second pixel circuit.

9. The display panel according to claim 7, further including a color film layer, wherein:
the color film layer includes color blockers corresponding to the second light-emitting devices, wherein one color blocker is located in one corresponding light transmitting region of the light blocking layer corresponding to one corresponding second light-emitting device.

10. The display panel according to claim 7, wherein:
the light-emitting device layer is provided with photosensitive openings located in the display region;
an orthographic projection of one photosensitive opening to the substrate is located within an orthographic projection of one corresponding light-transmitting region of the light-blocking layer to the substrate; and
an orthographic projection of one second photosensitive device to the substrate is located within an orthographic projection of one corresponding photosensitive opening to the substrate.

11. The display panel according to claim 10, wherein:
an orthographic projection of one second light-emitting device to the substrate is located within an orthographic projection of one corresponding light-transmitting region of the light-blocking layer to the substrate.

12. The display panel according to claim 7, further including:
a package structure layer on a side of the light-blocking layer away from the light-emitting device layer; and
a touch function layer on a side of the package structure layer away from the light-blocking layer.

13. The display panel according to claim 1, wherein:
the non-display region includes a virtual pixel region, and the first light-emitting devices are disposed in the virtual pixel region.

14. The display panel according to claim 13, wherein:
the virtual pixel region is located on at least one side of the display region.

15. The display panel according to claim 1, further including driving chips, wherein:
the driving chips are respectively connected with the first pixel circuits and the second pixel circuits, to control synchronization of working states of the first light-emitting devices and the second light-emitting devices through the first pixel circuits and the second pixel circuits, wherein device parameters of the first light-emitting devices and the second light-emitting devices are same.

16. A display device comprising a display panel, wherein:
the display panel has a display region and a non-display region, and includes:
a substrate;
a driving array layer on the substrate, including first pixel circuits located in the non-display region and second pixel circuits located in the display region;
a light-emitting device layer on a side of the driving array layer away from the substrate, including first light-emitting devices located in the non-display region and second light-emitting devices located in the display region, wherein the first light-emitting devices are electrically connected with the first pixel circuits respectively and the second light-emitting devices are electrically connected with the second pixel circuits respectively; and
a photosensitive device assembly including first photosensitive devices and second photosensitive devices arranged in the driving array layer, wherein an orthographic projection of one first photosensitive device to the substrate is at least partially overlapped with an orthographic projection of one corresponding first light-emitting device to the substrate, and the second photosensitive devices are arranged in the display region.

* * * * *